United States Patent
Boulant et al.

(10) Patent No.: US 10,545,210 B2
(45) Date of Patent: Jan. 28, 2020

(54) LOCAL TEMPERATURE RISE CONSTRAINED RADIO FREQUENCY PULSE DESIGN IN PARALLEL TRANSMISSION

(71) Applicant: REGENTS OF THE UNIVERSITY OF MINNESOTA, St. Paul, MN (US)

(72) Inventors: Nicolas Boulant, Gif-sur-Yvette (FR); Pierre-Francois Van De Moortele, Minneapolis, MN (US)

(73) Assignees: Regents of the University of Minnesota, Minneapolis, MN (US); Commissariat A L'Energie Atomique et Aux Energies Alternatives, Paris (FR)

( * ) Notice: Subject to any disclaimer, the term of this patent is extended or adjusted under 35 U.S.C. 154(b) by 255 days.

(21) Appl. No.: 15/513,042

(22) PCT Filed: Sep. 22, 2015

(86) PCT No.: PCT/US2015/051425
§ 371 (c)(1),
(2) Date: Mar. 21, 2017

(87) PCT Pub. No.: WO2016/049013
PCT Pub. Date: Mar. 31, 2016

(65) Prior Publication Data
US 2017/0307710 A1    Oct. 26, 2017

Related U.S. Application Data

(60) Provisional application No. 62/053,603, filed on Sep. 22, 2014.

(51) Int. Cl.
G01V 3/00        (2006.01)
G01R 33/561    (2006.01)
(Continued)

(52) U.S. Cl.
CPC ....... *G01R 33/5612* (2013.01); *G01R 33/288* (2013.01); *G01R 33/543* (2013.01)

(58) Field of Classification Search
USPC ......................................................... 324/309
See application file for complete search history.

(56) References Cited

U.S. PATENT DOCUMENTS

2010/0134105 A1    6/2010    Zelinski et al.
2012/0256626 A1   10/2012    Adalsteinsson et al.
(Continued)

OTHER PUBLICATIONS

International Search Report and Written Opinion for international application No. PCT/US2015/051425 dated Dec. 21, 2015.
(Continued)

*Primary Examiner* — Rodney E Fuller
(74) *Attorney, Agent, or Firm* — Quarles & Brady LLP (57) ABSTRACT

Systems and methods for designing RF pulses using a technique that directly controls temperature rise via a compression model that is based on virtual observation points ("VOPs") are provided. Thermal pre-simulations are first carried out for a given RF exposure time, coil, and subject model in order to obtain complex temperature matrices, after which the compression scheme follows. As one example, the thermal model employed can be Pennes' bio-heat equation. Focusing design constraints on the temperature rise instead of the absolute temperature allows for uncertain parameters to be dropped from the thermal model, making it more robust and less prone to errors. In some embodiments, the algorithm used for RF pulse design is the active-set ("A-S") method.

15 Claims, 7 Drawing Sheets

(51) Int. Cl.
*G01R 33/28* (2006.01)
*G01R 33/54* (2006.01)

(56) References Cited

U.S. PATENT DOCUMENTS

2014/0300354 A1    10/2014  He et al.
2015/0273230 A1*   10/2015  Guerin .................. A61N 1/403
                                                                607/101

OTHER PUBLICATIONS

Neufeld et al., Analysis of the local worst-case SAR exposure caused by an MRI multi-transmit body coil in anatomical models of the human body, Phys. Med. Biol. 56 (2011) 4649-4659.
Deniz et al., Specific Absorption Rate Benefits of Including Measured Electric Field Interactions in Parallel Excitation Pulse Design, Magnetic Resonance in Medicine 67:164-174 (2012).
Massire et al., Thermal Simulations in the Human Head for High Field MRI Using Parallel Transmission, Journal of Magnetic Resonance Imaging 35:1312-1321 (2012).
Zhu et al., System and SAR Characterization in Parallel RF Transmission, Magnetic Resonance in Medicine 67:1367-1378 (2012).
Cloos et al., Local SAR Reduction in Parallel Excitation Based on Channel-Dependent Tikhonov Parameters, Journal of Magnetic Resonance Imaging 32: 1209-1216 (2010).
Graesslin et al., SAR Hotspot Reduction by Temporal Averaging in Parallel Transmission, Proc. Intl. Soc. Mag. Reson. Med. 17 (2009).

* cited by examiner

SPECIFIC ABSORPTION RATE
VIRTUAL OBSERVATION POINTS

TEMPERTURE
VIRTUAL OBSERVATION POINTS

LOCAL TEMPERATURE RISE CONSTRAINED RADIO FREQUENCY PULSE DESIGN IN PARALLEL TRANSMISSION

CROSS-REFERENCE TO RELATED APPLICATIONS

This application represents the U.S. National Stage of International Application No. PCT/US2015/051425, filed Sep. 22, 2015 which claims the benefit of U.S. Provisional Patent Application Ser. No. 62/053,603, filed on Sep. 22, 2014, and entitled "LOCAL TEMPERATURE RISE CONSTRAINED RADIO FREQUENCY PULSE DESIGN IN PARALLEL TRANSMISSION."

STATEMENT REGARDING FEDERALLY SPONSORED RESEARCH

This invention was made with government support under EB 015894 awarded by the National Institutes of Health. The government has certain rights in the invention.

BACKGROUND OF THE INVENTION

The field of the invention is systems and methods for magnetic resonance imaging ("MRI"). More particularly, the invention relates to systems and methods for designing radio frequency ("RF") pulses for use in parallel transmission MRI.

Although there is a general consensus that temperature is the true relevant radio frequency ("RF") related safety parameter, tracking specific absorption rate ("SAR") in MR exams and in RF pulse design has remained the gold standard. The fact that SAR has remained the gold standard can probably be explained by the complexity of bio-heat equation models and the lack of fast temperature mapping methods.

Given the multi-factorial dependence of temperature, SAR computation has been a great simplification for handling safety, which has been supported by experimental evidence. Whereas RF coil technology, static field intensity, and temperature guidelines have evolved throughout the years, SAR thresholds have essentially remained identical.

In a recent study by A. Massire, et al., "Thermal simulations in the human head for high field MRI using parallel transmission," J Magn Reson Imaging 2012; 35:1312-1321, a series of thermal simulations was conducted on a numerical human head model containing 20 anatomical structures in order to verify the consistency between the SAR and temperature guidelines for parallel transmission (pTx) RF exposures at 7 T. Thousands of different RF scenarios were simulated. In these models, starting from the equilibrium temperature (i.e. the steady-state obtained when there is no RF heat source), the temperature almost never exceeded 38° C. over 30 minutes of RF pulsing as long as 10-g average SAR did not exceed its limit of 10 W/kg.

These simulations, however, relied on the validity of Pennes' bioheat model whose constant blood temperature assumption is currently debated. Motivated also by the lack of direct correspondence between temperature and SAR, the RF pulse design for a time-of-flight (TOF) sequence under strict absolute temperature constraints was investigated numerically, whereby strict SAR constraints were adjusted in a feedback-based manner to fulfill the temperature constraints. Although the IEC guidelines in general involve upper limits for absolute temperature, the latter actually appears quite dependent on daily fluctuations caused by uncontrolled events occurring in the patient's life (fever, physical activity, stress, weather etc). Furthermore, in vivo absolute temperature measurement with MR is still extremely challenging.

SUMMARY OF THE INVENTION

The present invention overcomes the aforementioned drawbacks by providing a method for designing parallel transmission radio frequency ("RF") pulses for use in magnetic resonance imaging ("MRI"). The method includes providing a set of pre-computed temperature matrices to a computer system, where the temperature matrices describe temperature rises in response to RF pulses based on a linear thermal model. A set of temperature virtual observation points ("TVOPs") based on the pre-computed temperature matrices is then selected, and a plurality of RF pulse waveforms for use in MRI are computed by solving an optimization problem that is constrained by a maximum temperature rise evaluated at the set of TVOPs.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Described here are systems and methods for utilizing parallel transmission in magnetic resonance imaging ("MRI") to mitigate B1+ inhomogeneities while explicitly constraining the temperature rise during parallel transmission. By way of example, finite difference time domain simulations can be performed on a numerical human head model and for a 16 channel coil at 10.5 Tesla. Based on a set of pre-computations, a virtual observation point compression model for the temperature rise is derived. This compact representation is then used in a nonlinear programming algorithm for pulse design under explicit temperature rise constraints.

In the example of a time-of-flight sequence, radio frequency ("RF") pulse performance in some cases is increased by a factor of two compared to specific absorption rate ("SAR") constrained RF pulses, while temperature rise is directly and efficiently controlled. RF pulse performance can be gained by relaxing the SAR constraints, but at the expense of a loss of direct control on temperature.

There remains a need for accurate safety control at ultra-high magnetic field strengths, especially given the lack of correspondence between SAR and temperature. It is contemplated that the systems and methods described here will provide for safer and more efficient magnetic resonance imaging at these ultra-high field strengths, as well as at more routine clinical magnetic field strengths.

As will be described below in more detail, the systems and methods of the present invention design RF pulses using a technique that explicitly controls temperature rise via a compression model that is based on virtual observation points ("VOPs"). Thermal pre-calculations are first carried out for a given RF exposure time, coil, and subject model in order to obtain complex temperature matrices, T, after which the compression scheme is implemented. As one example, the thermal model employed can be Pennes' bio-heat equation. As will be shown, focusing on the temperature rise instead of the absolute temperature allows for uncertain parameters to be dropped from the thermal model, making it more robust and less prone to errors. A nonlinear programming algorithm can be implemented for designing the RF pulses. In some embodiments, the algorithm used for RF pulse design is based on the active-set ("A-S") method, which has been previously shown to be fast, robust, and powerful for nonlinear programming problems.

Figure 1:
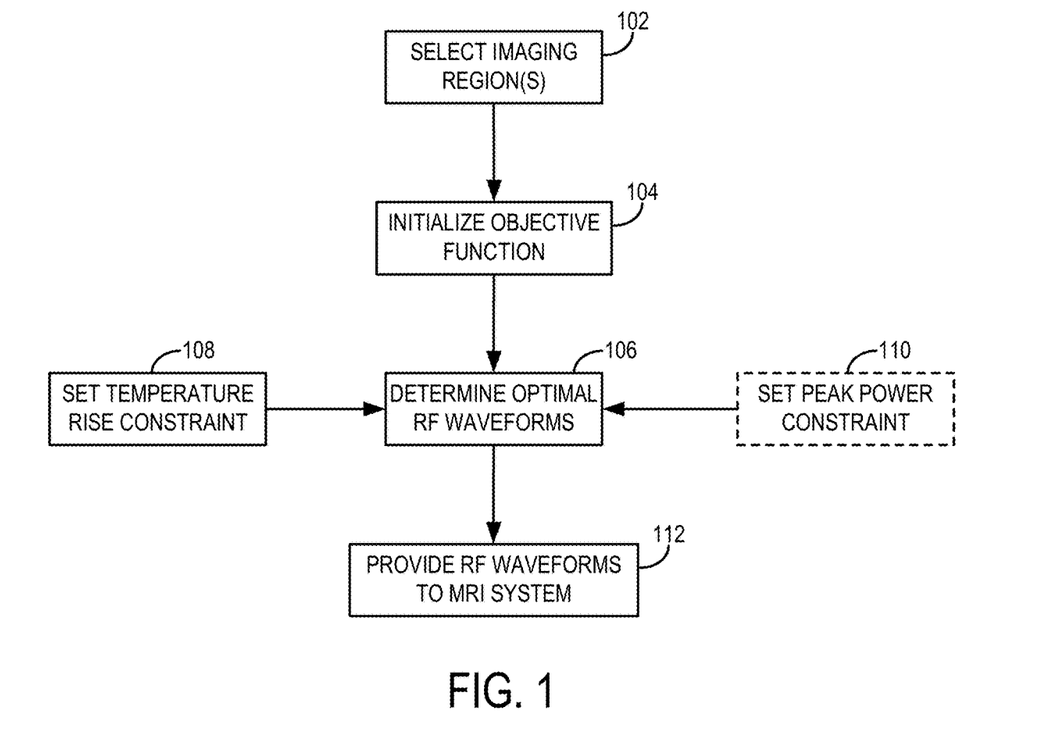
FIG. 1 is a flowchart setting forth the steps of an example method for designing radio frequency ("RF") pulse waveforms subject to a temperature rise constraint.

Referring now to FIG. 1, a flowchart is illustrated as setting forth the steps of an example method for designing one or more RF pulses for use in MRI, in which the RF pulses are optimized to minimize B1+ inhomogeneities while minimizing the temperature rise that will be caused in a subject when the designed RF pulses are applied to that subject.

The method includes selecting at least one region to be imaged within a subject, as indicated at step 102. In some implementations, previously acquired images of the subject can be used for determining or identifying the regions to be imaged, and for which the RF pulses should be designed.

As indicated at step 104, an objective function is then initialized using the selected regions. In general, this step can include providing an encoding matrix for each region, and a desired flip angle for each region. As one example, the objective function can be based on a magnitude least squares ("MLS") problem having the following form:

$$f(x) = \||AX| - \theta\|_2^2 \qquad (1);$$

where A is a diagonal matrix whose diagonal entries, $A_n$, correspond to the encoding matrix for each region in units of flip angle per square root of power, X is a vector whose entries, $X_n$, correspond to the RF pulses waveforms designed to be applied to the $n^{th}$ region; and θ is a vector whose entries, $\theta_n$, correspond to the flip angle for the RF pulses designed to be applied to the $n^{th}$ region.

As a specific example in which two different regions are selected for imaging, Eqn. (1) can have the following form:

$$f\left(X = \begin{bmatrix} X_1 \\ X_2 \end{bmatrix}\right) = \left\| \left| \begin{bmatrix} A_1 & 0 \\ 0 & A_2 \end{bmatrix} \begin{bmatrix} X_1 \\ X_2 \end{bmatrix} \right| - \begin{bmatrix} \theta_1 \\ \theta_2 \end{bmatrix} \right\|_2^2; \qquad (2)$$

where the matrices $A_1$ and $A_2$ have the units of flip angle per square root of power (W), and encode the spins' dynamics in the small tip angle approximation for the first and second regions, respectively, of the excitation volume-of-interest. As an example, $\theta_1$ can equal 20 degrees and $\theta_2$ can equal 60 degrees.

A set of RF waveforms is then determined by optimizing the objective function, as indicated at step 106. The optimization problem can be solved using an appropriate nonlinear programming algorithm. As one example, the nonlinear programming algorithm can include an active-set ("A-S") algorithm. It will be appreciated, however, that other methods can also be used in the pulse design problem. For example, interior point methods could also be used.

When using the A-S algorithm, it can be implemented via the optimization toolbox of Matlab (The Mathworks, Natick, Mass., USA). The A-S algorithm is an iterative (Quasi-Newton) procedure where, at each step, the problem is approximated by a quadratic program with the constraints linearized. The number of iterations (i.e., the number of times the quadratic problem was solved) for this implementation of the temperature constraint pulse design can be set to a predetermined number of iterations, such as 300; however, it will be appreciated that other stopping criterion could also be suitably implemented.

Based on the example objective function in Eqn. (2), as one example for the RF pulse design a $k_T$-spokes technique can be used so that $x_1$ and $x_2$ are, respectively, a 2 $k_T$-spoke pulse and 3 $k_T$-spoke pulse. In this example, each sub-pulse can be a one millisecond sinc pulse apodized with a Hanning window and with a time-bandwidth product equal to four. Further, in this example the duty-cycle can be taken as 20 percent.

Referring still to FIG. 1, and as mentioned above, the optimization problem is constrained using a temperature rise constraint, as indicated at step 108. In general, the temperature rise constraint can be implemented using compressed temperature matrices, thereby reducing the computational complexity of the RF design process. As one example, the compressed temperature matrices can be evaluated at a set of temperature virtual observation points ("TVOPs"). As one example, the temperature rise constraint can be, $$c_i(x) \leq T_{max}, \quad i=1, \ldots, N_{TVOPs} \qquad (3);$$

where $N_{TVOPs}$ is the number of TVOPs obtained after compression and $c_i(x)$ are the values over the temperature rises calculated over the TVOPs, with the predefined tolerance. The temperature rise constraint is described below in more detail. In addition, other constraints can be implemented, such as peak power constraint, as indicated at step 110. As one example, a peak power constraint can be defined as, $$c_{p,k}(x) = |x_k|^2 \leq 2kW, \; k = 1, \ldots, N_c N_{kT} \quad (4).$$

The optimization of the objective function can also take into consideration other factors, including RF frequency, average power, number of RF channels, and so on.

The designed RF pulse waveforms can be provided to an MRI system, as indicated at step 112. The MRI system can then be programmed or otherwise directed to generate RF pulses, preferably using parallel transmission, using the designed RF waveforms in order to achieve a desired effect in the selected regions. Because of the constraint on temperature rise, the applied RF pulses will not cause a significant temperature rise in the subject.

Figure 2:
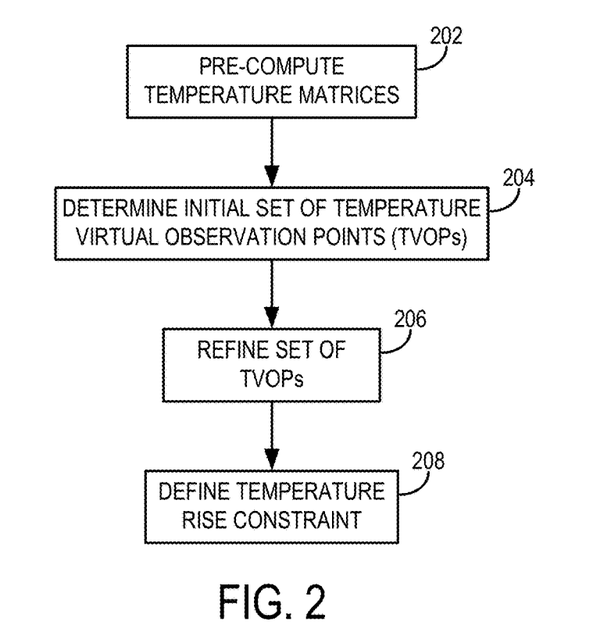
FIG. 2 is a flowchart setting forth the steps of an example method for setting a temperature rise constraint based on determining a set of temperature virtual observation points ("TVOPs") at which temperature rise should be evaluated.

Referring now to FIG. 2, a flowchart is illustrated as setting forth the steps of an example method for setting a temperature rise constraint based on TVOPs. In general, the method includes pre-computing a number of temperature matrices and then reducing the set of temperature matrices to a compressed set of TVOPs.

The method thus includes pre-computing a plurality of temperature matrices, as indicated at step 202. In particular, the temperature matrices described here model a temperature rise, but could also be readily adapted to model absolute temperature. One method for pre-computing these temperature matrices is now described.

A general linear absolute temperature model may be written as, $$\rho c_p \frac{\partial T}{\partial t} = f(T) + g + \rho SAR; \quad (5)$$

where $\rho$ is the tissue density (kg/m$^3$), $c_p$ is the specific heat capacity (J/kg/K), T is the local temperature (K), $f$ is a linear function of temperature, and g is an RF source-independent function leading to a nonzero equilibrium temperature in the absence of RF. All terms may be spatially dependent. In the case of Pennes' bio-heat model, the different terms are, $$f(T(r)) = \nabla \cdot (k(r) \nabla T(r)) - B(r)T(r) \quad (6);$$

where $g(r) = B(r)T_b(r) + C(r)$; k is the thermal conductivity (W/K/m); B is the perfusion constant (W/K/m$^3$); $T_b$ is the constant blood temperature (K); and C is the metabolic rate (W/m$^3$). As discussed above, modeling based on the absolute temperature introduces uncertainties into the RF pulse design process because both $f(T(r))$ and g(r) must be known. Some uncertainties can be mitigated, however, by modeling based on the temperature rise instead. To restructure the thermal model accordingly, the absolute temperature, T, can first be set to be equal to the equilibrium temperature, $T_{eq}$, (i.e. the steady state obtained when there is no RF heat source) plus the temperature rise $\Delta T$. This modification to the thermal model in Eqn. (5) yields the following:

$$\rho c_p \frac{\partial \Delta T}{\partial t} = f(\Delta T) + \rho SAR; \quad (7)$$

In making this modification, the variable, g, which contains $T_b$ and C, drops out of the equation. In this instance, the temperature rise does not depend on the equilibrium temperature or on the possibly uncertain function, g.

SAR can be calculated by using Hermitian local matrices, Q(r), defined for every voxel as, $$Q(r) = \frac{\sigma}{2\rho}(E_x^\dagger E_x + E_y^\dagger E_y + E_z^\dagger E_z); \quad (8)$$

where $E_x$, $E_y$, and $E_z$ are normalized complex row vectors containing electric field values coming from each channel, and for the corresponding axis, at the location, r. Given $N_T$-point time waveforms dispatched on $N_c$ channels, $I_c$ being the $N_T$-by-$N_c$ array containing all these waveforms, for 100 percent duty cycle the SAR at voxel, r, is given by:

$$SAR(r) = \frac{1}{N_T} \sum_{i,j}^{N_c} Q_{i,j}(r)(I_c^\dagger I_c)_{i,j}; \quad (9)$$

where i and j respectively refer to the row and column indices of the corresponding matrices. Because Eqn. (7) is linear with respect to the RF heat source, it can be numerically solved for each $Q_{i,j}(r)$ map to obtain, for a given duration, a corresponding $\Delta T_{i,j}(r)$ complex distribution, which is a solution of the following:

$$\rho c_p \frac{\partial \Delta T_{i,j}(r)}{\partial t} = f(\Delta T_{i,j}(r)) + \rho Q_{i,j}(r). \quad (10)$$

Because $Q_{i,j}(r)$ and $Q_{j,i}(r)$ are complex conjugates, by construction so are $\Delta T_{i,j}(r)$ and $\Delta T_{j,i}(r)$. After $N_c(N_c+1)/2$ computations, which may be pre-computations, and by exploiting the linearity of the model, the temperature rise, $\Delta T(r)$, at any point can be calculated using complex matrices, T(r), which can be defined as:

$$T(r) = \begin{bmatrix} \Delta T_{1,1}(r) & \cdots & \Delta T_{1,N_c}(r) \\ \vdots & \ddots & \vdots \\ \Delta T_{N_c,1}(r) & \cdots & \Delta T_{N_c,N_c}(r) \end{bmatrix}; \quad (11)$$

so that for any waveform array, the following is obtained:

$$\Delta T(r) = \frac{1}{N_T} \sum_{i,j}^{N_c} \Delta T_{i,j}(r)(I_c^\dagger I_c)_{i,j}. \quad (12)$$

These matrices, T(r), are the temperature matrices that can be pre-computed. For a static RF shim with the x-vector containing the $N_c$ complex weights, the previous result becomes, $$\Delta T(r) = x^\dagger T(r) x \quad (13).$$

Using pre-computations as described above, the computation of the temperature rises can be sped up for fast optimization. As one example, pre-computations can be performed using a finite difference time domain ("FDTD") method.

In one non-limiting example of implementing the methods described above, FDTD-based electromagnetic simulations were used to perform simulation of the $B_1$ and electric fields. Once computed, the field maps were eventually downsampled to a 4×4×4 mm³ grid to make the SAR and thermal calculations more tractable. After computing the Q matrices for each voxel, $Q_{10\,g}$ matrices were constructed to calculate 10-g SAR values by using a region-growing algorithm. A global SAR $Q_G$ matrix was obtained by averaging the energy density over the relevant mass. With all these Q matrices available, the T matrices and TVOPs could be computed for each sequence duration.

While SAR averaging guidelines (10-g or global) dilute the spurious electric field spikes due to stair-casing errors in FDTD simulations, temperature calculations arising from voxel-wise SAR distributions are more sensitive to numerical artifacts and can lead to unrealistic temperature rises, even when taking into account heat diffusion effects. These electric field spikes may lead to special SAR averaging rules at the skin interface, where large discontinuities in conductivity typically occur. Due to the speckle noise nature of these spurious spikes, the electric field maps can be suitably filtered to remove the spikes. As one example, a 3×3×3 median filter can be applied to the electric field distributions for each channel, due to the efficiency of this filter to remove this particular kind of noise. The filtered electric field distributions can be used both for SAR and temperature calculations.

Referring again to FIG. 2, the method for setting a temperature rise constraint next selects an initial set of TVOPs based on the computed temperature matrices, as indicated at step 204. For instance, once the temperature matrices, T(r), have been computed (e.g., built from the $\Delta T_{i,j}$ elements), the number of constraints can be compressed based, in part, on the knowledge that the temperature rise for an arbitrary pulse can be compactly calculated. In particular, a TVOP compression scheme can be implemented.

As one example, assuming a discretized model of the volume exposed to the radio frequency field, there can be as many constraints as there are voxels (i.e., on the order of tens of thousands to hundreds of thousands, depending on the model resolution). The TVOPs can thus be defined as the matrices among the T matrices obtained via the pre-computations that provide a lower-bound and upper-bound of the maximum temperature rise obtained over the whole model.

It is noted that the T matrices, and thus the TVOPs, can be computed in a number of different ways. In some embodiments, the TVOPs can be computed based on measurements of $B_1^+$ and $B_0$ and using model-based E-field values to calculate E-fields. This approach is non-specific to the subject being imaged. In some other embodiments, the TVOPs can be computed based on measurements of $B_1^+$ and $B_0$ and using a E-field algorithm to generate E-field measurements specific to the subject being imaged. As one example, the E-field algorithm can be the one described in co-pending U.S. patent application Ser. No. 14/245,145, which is herein incorporated by reference in its entirety.

By defining $\Delta T_G$ as the average temperature rise (with a corresponding temperature matrix) over the whole volume, the TVOPs can be defined as the set of T matrices, which guarantees that, $$\exists k \in \text{TVOPs such that } \Delta T_k \leq \max(\Delta T(r)) \leq \Delta T_k + \lambda \cdot \Delta T_G \quad (14);$$

where $\lambda$ is a tolerance factor that controls the level of compression and $\Delta T_k$ denotes the temperature rise calculated for the $k^{th}$ TVOP. In general, larger values of $\lambda$ will result in more compression (i.e., fewer TVOPs). Instead of the matrix $\Delta T_G$, the identity matrix can also be used. In this case, the tolerance is expressed in terms of the average RF power.

Because the T matrices depend on the duration of the RF exposure, the TVOPs will also depend on the duration of the RF exposure. By construction of the TVOPs, it is thereby ensured that the maximum temperature rise over the full model is always upper-bounded by one of the TVOPs plus the defined tolerance, and lower bounded by the maximum over the TVOPs.

To select the initial set of TVOPs, the T matrices are first sorted according to their maximum eigenvalues in decreasing order. The set of TVOPs is then initialized as the first T matrix in the sorted list.

Referring again to FIG. 2, the initial set of TVOPs can be further refined, as indicated at step 206. As one example, the set of TVOPs can be reduced based on a search for a set of N positive coefficients, $c_n$, where N is the current number of TVOPs. In particular, the set of coefficients that is searched for has the sum, $$\sum_{n}^{N} c_n = 1. \quad (15)$$

A candidate TVOP, T, is added to the initial set of TVOPs unless a set of coefficients that renders the following metric to be nonnegative can be found for that candidate TVOP:

$$\sum_{n}^{N} c_n TVOP_n + \lambda T_G - T; \quad (16)$$

where T is the candidate TVOP and $T_G$ is the global temperature matrix (returning the average temperature rise scalar quantity, $\Delta T_G$). If a set of coefficients, $c_n$, is found such that the metric in Eqn. (16) is nonnegative, then the candidate T matrix is not retained as a TVOP; otherwise, the candidate T is selected as an additional TVOP.

After the set of TVOPs has been refined, the temperature constraint is defined, as indicated at step 208. For example, the temperature constraint can be defined based on a selected maximum temperature value, $T_{max}$, such as, $$c_i(x) \leq T_x \text{ for } i=1, \ldots, N_{TVOPs} \quad (17).$$

The maximum temperature, $T_{max}$, corresponds to the maximum allowable rise in temperature, and can be selected as any suitable value that constrains the temperature rise to safe values. For instance, $T_{max}$ can be in the range of about 1.0-2.0 degrees Celsius.

EXAMPLES

Figure 3A:
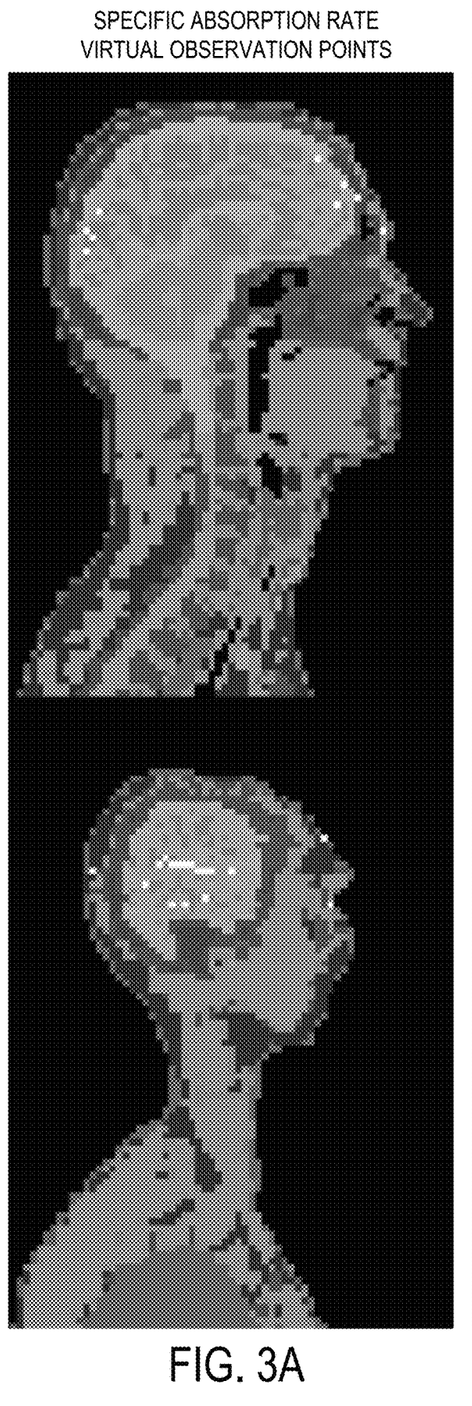
FIG. 3A illustrates an example of specific absorption rate ("SAR") virtual observation points, shown as white squares in two different sagittal slices.
Figure 3B:
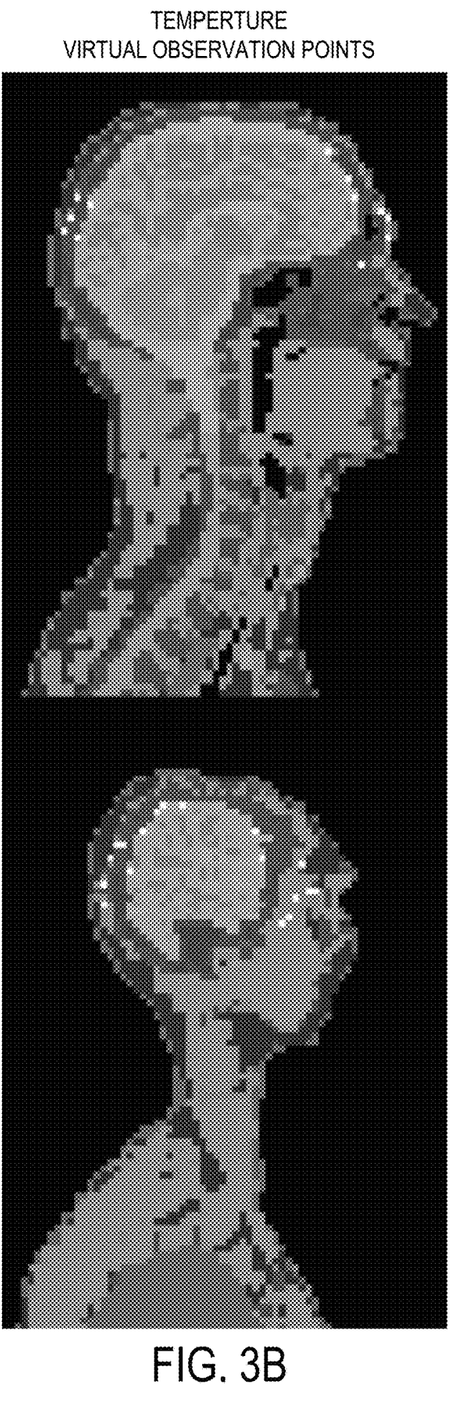
FIG. 3B illustrates an example of TVOPs, shown as white squares in the same two sagittal slices as depicted in FIG. 3A.

An example set of SAR virtual observation points ("VOPs") computed for a subject is illustrated in FIG. 3A, and an example set of TVOPs determined according to the methods described here for the same subject is illustrated in FIG. 3B. In this example, 389 different SAR VOPs and TVOPs were determined over a whole model, and were obtained with a compression factor of $\lambda=10$ and were determined for a thirty minute acquisition time. The dependence of temperature is multifactorial and does not simply depend on SAR hotspots. Thus, the locations of the TVOPs, shown as white squares in FIG. 3B, are not correlated with the locations of the SAR VOPs, shown as white squares in FIG. 3A. While the SAR VOPs can be located deep inside the brain, the TVOPs are mostly located in low-perfused regions (e.g., skin, muscle, cerebrospinal fluid). The compressibility of the model improves with the duration of the sequence. For example, keeping $\lambda=10$, the number of TVOPs in the example illustrated in FIG. 3B (i.e., 389 TVOPs for a thirty minute sequence) increases to 483 for a ten minute sequence, and to 551 for a six minute sequence.

Figure 4:
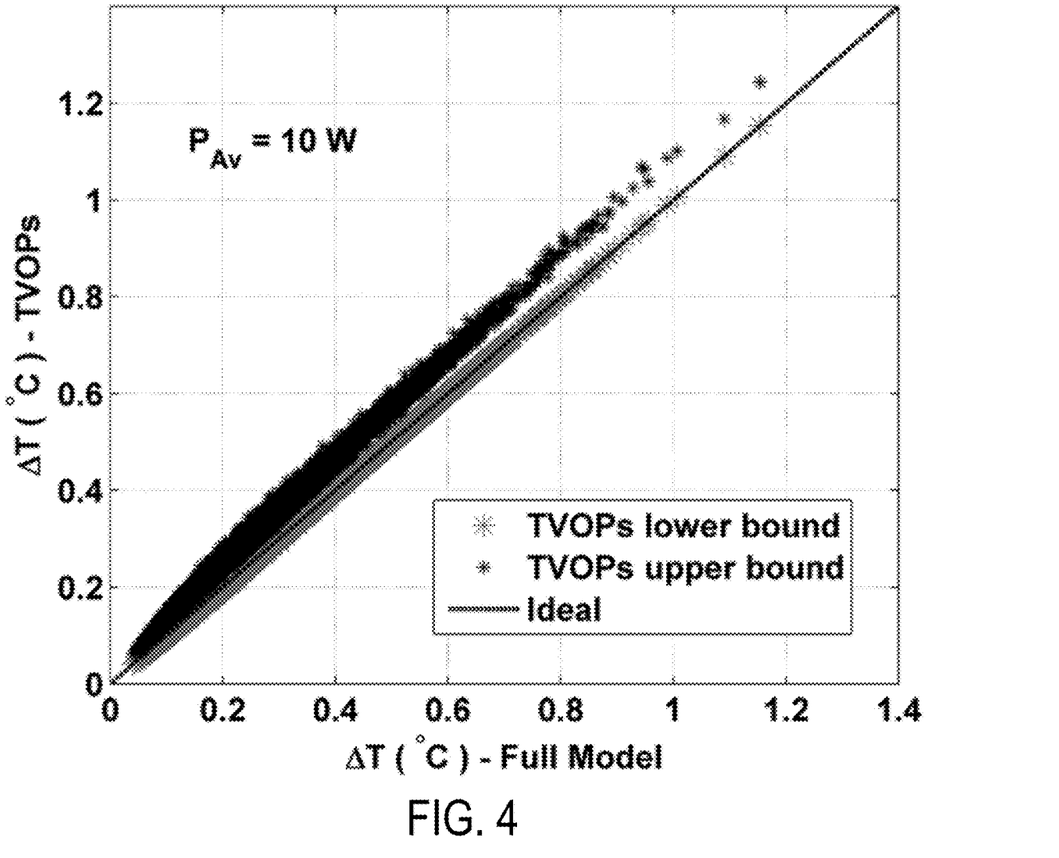
FIG. 4 illustrates a validation of TVOPs for a six minute sequence. Twenty thousand random RF waveforms were used to compute a SAR distribution, which yielded a maximum temperature rise over a full model, a maximum temperature over the TVOPs, and a maximum temperature over the TVOPs plus a defined tolerance. The results are scaled for 10 W total RF power.
Figure 5:
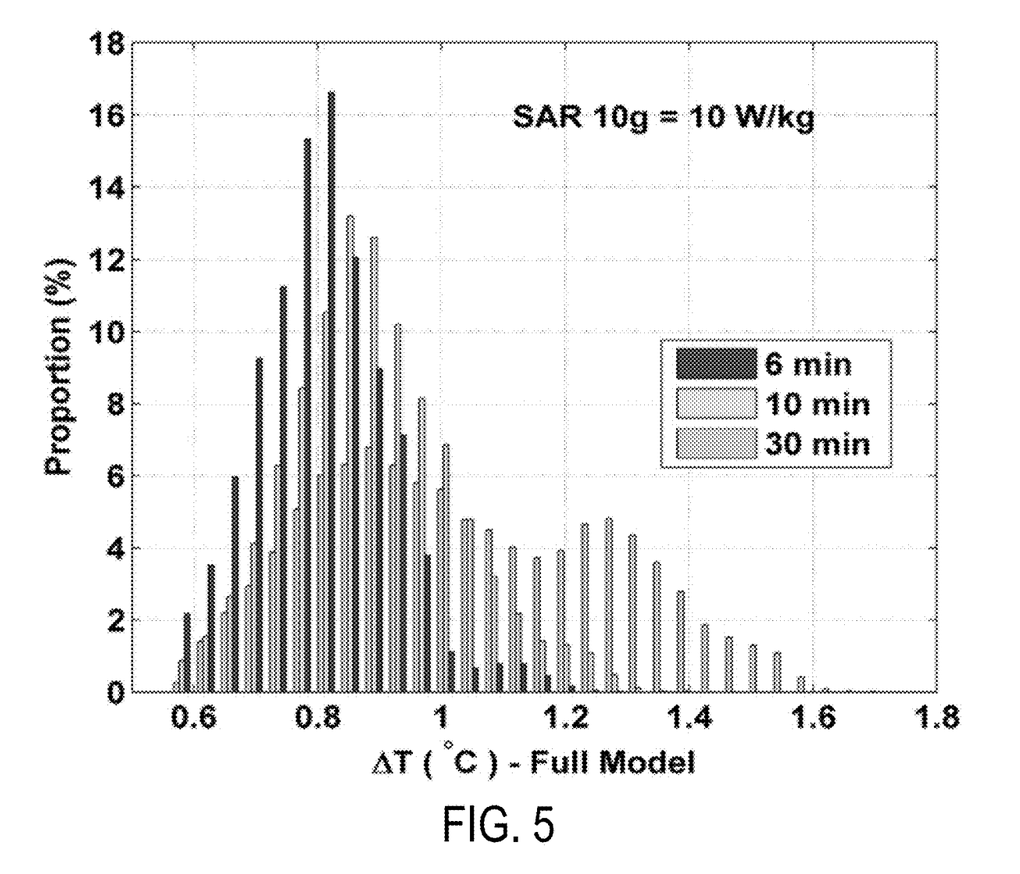
FIG. 5 depicts histograms of the maximum temperature rises for different sequence durations, calculated over 20,000 random scenarios. The waveforms are scaled to always yield 10 W/kg peak 10-g SAR. The global SAR limit of 3.2 W/kg was never reached.

FIG. 4 illustrates a validation of an example set of TVOPs determined for a six minute sequence, with the temperature rise calculated over the TVOPs, the same temperature plus the defined tolerance, and the temperature calculated over the whole model. The temperature calculated over the whole model (shown as a dashed line) is upper-bounded by the TVOPs plus the selected tolerance, and is lower-bounded by the TVOPs. The calculation was performed for 20,000 random RF waveforms having a uniform distribution for amplitude and phase. The total power for each waveform was scaled to 10 W. In addition, FIG. 5 depicts histograms of the maximum temperature rises for six, ten, and thirty minute RF exposures, computed with the same 20,000 random RF scenarios. In FIG. 5, however, the results were scaled so that the peak 10-g SAR was always equal to 10 W/kg. The global SAR threshold of 3.2 W/kg was never reached in the results shown in FIG. 5. Despite the peak 10-g SAR being always the same, these examples illustrate that the maximum temperature rise can reach a range of different values, and show that there is no one-to-one mapping between the peak 10-g SAR and the maximum temperature rise. Also, the longer the sequence, the wider the temperature distribution becomes, with a double hump furthermore appearing for the thirty min sequence.

Table 1 summarizes the results of an example pulse design using the A-S algorithm under various constraints, for six, ten, and thirty minutes time-of-flight sequences.

TABLE 1

| Constraint | NRMSE (%) | SAR 10 g (W/kg) | SAR Global (W/kg) | Temperature (° C.) |
|---|---|---|---|---|
| 6 min | | | | |
| Temperature | 10.8 | 13.4 | 5.3 | 1 |
| Temperature | 8.5 | 21 | 6.9 | 1.5 |
| Temperature | 8.1 | 27.3 | 7.6 | 2 |
| Temperature | 11.4 | 12.6 | 4.9 | 0.91 |
| SAR | 9.7 | 13.4 | 5.3 | 1.28 |
| SAR | 8.3 | 21 | 6.9 | 1.93 |
| SAR | 8.1 | 27.3 | 7.6 | 2.38 |
| SAR (IEC) | 16.2 | 10 | 3.2 | 0.91 |
| 10 min | | | | |
| Temperature | 12.6 | 11.5 | 4.5 | 1 |
| Temperature | 9.0 | 17.8 | 6.3 | 1.5 |
| Temperature | 8.3 | 24.7 | 7.3 | 2 |
| Temperature | 11.4 | 12.4 | 4.8 | 1.1 |
| SAR | 11.2 | 11.5 | 4.5 | 1.38 |
| SAR | 8.5 | 17.8 | 6.3 | 2.07 |
| SAR | 8.2 | 24.7 | 7.3 | 2.80 |
| SAR (IEC) | 16.2 | 10 | 3.2 | 1.10 |
| 30 min | | | | |
| Temperature | 15.5 | 10.7 | 3.9 | 1 |
| Temperature | 10.6 | 16.0 | 5.5 | 1.5 |
| Temperature | 8.7 | 21.8 | 6.7 | 2 |
| Temperature | 11.3 | 14.4 | 5.1 | 1.37 |
| SAR | 12.9 | 10.7 | 3.9 | 1.60 |
| SAR | 9.2 | 16.0 | 5.5 | 2.34 |
| SAR | 8.2 | 21.8 | 6.7 | 2.79 |
| SAR (IEC) | 16.2 | 10 | 3.2 | 1.37 |

The A-S algorithm converged to a local minimum after 300 iterations in about 30 seconds for the SAR and temperature-constrained pulse designs. The peak power constraint (2 kW in this example) was always saturated. For sequence durations up to 30 minutes, the pulse design under explicit temperature rise constraints noticeably outperformed the pulse design constrained under SAR, with a lower Normalized Root Mean Square Error ("NRMSE").

Figure 6:
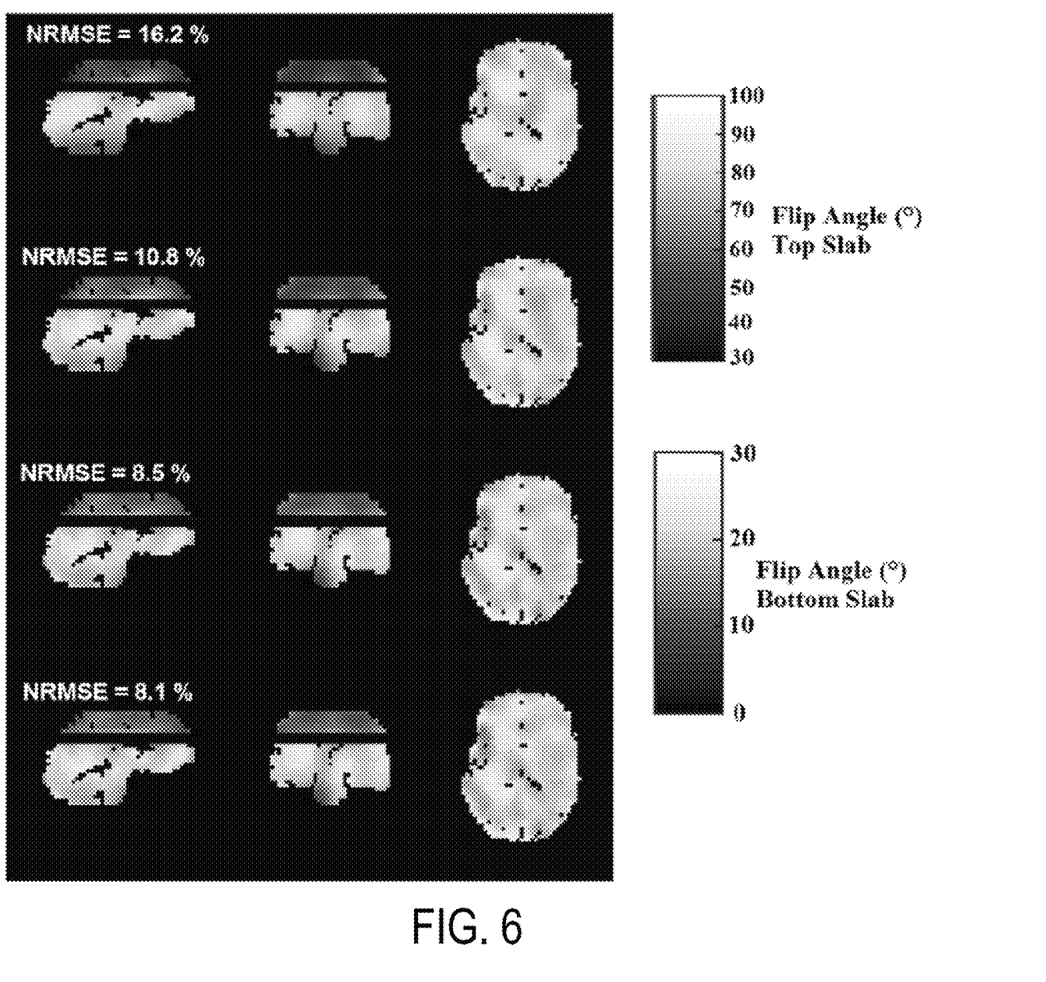
FIG. 6 depicts flip angle distributions for different pulse designs, which from top to bottom include SAR-constraint pulse design and 1° C., 1.5° C., 2° C. temperature-constraints pulse designs.
Figure 7:
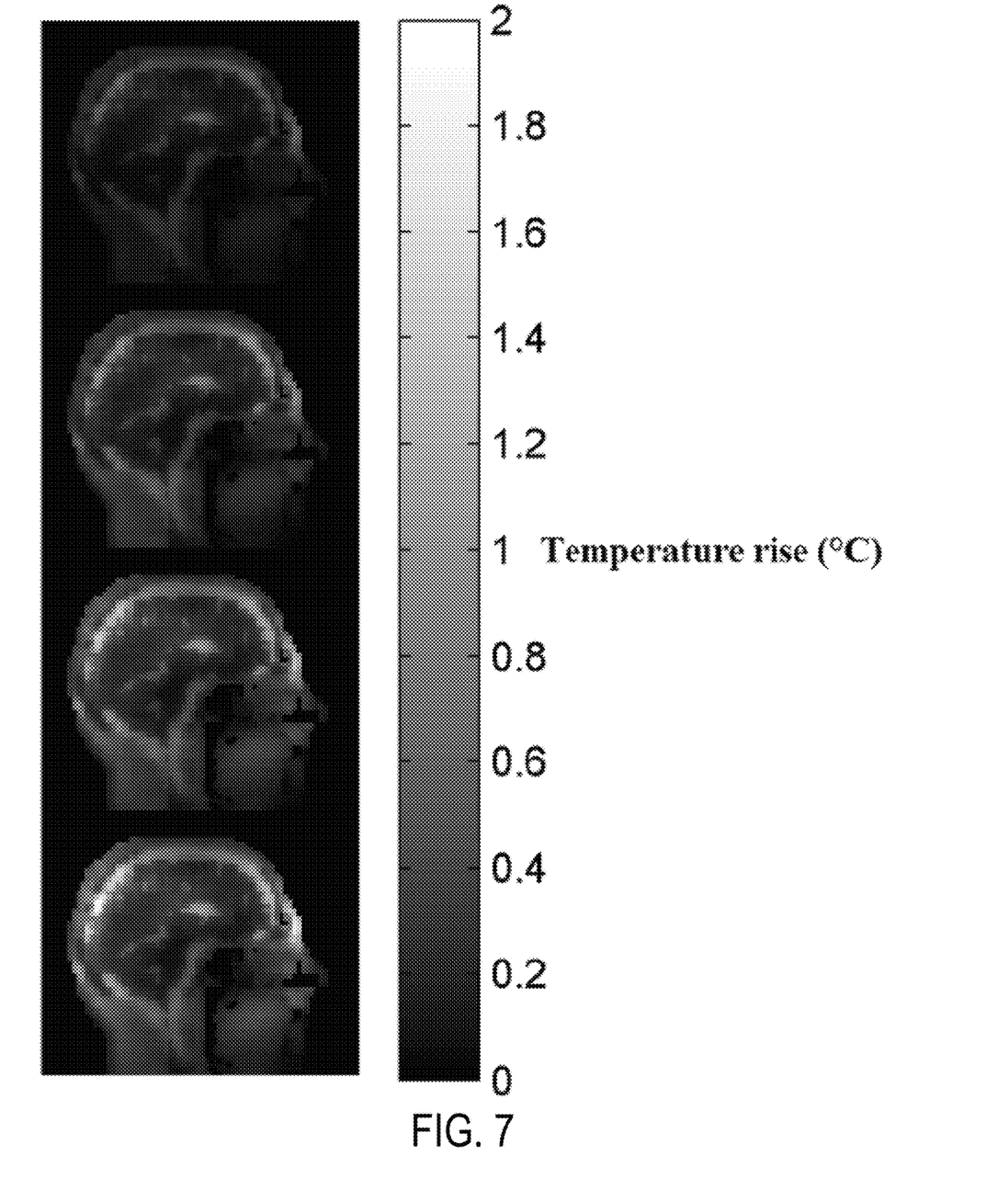
FIG. 7 depicts resulting temperature rises for different pulse designs, which from top to bottom include SAR-constraint pulse design and 1° C., 1.5° C., 2° C. temperature-constraints pulse designs.

Examples of flip angle maps and temperature rise maps determined for the 6 minute sequence are illustrated in FIGS. 6 and 7, respectively. While the target flip angles in FIG. 6 cannot be achieved in the SAR-constraint pulse design case, the correct flip angles can be obtained in the temperature rise constrained case as the temperature rise can be progressively increased in a controlled manner. The corresponding temperature rises are shown in FIG. 7, where the hot spots mainly occur in the skin and CSF regions.

An efficient algorithm for directly constraining the temperature rise in RF pulse design using parallel transmission ("pTx"), which is applicable for high and ultra-high magnetic field strengths, has been provided. Although the international guidelines generally involve absolute temperature constraints, for which some approaches have been proposed, constraining the temperature rise provides a more conservative and practical approach for designing safe and efficient RF pulses. The systems and methods provided here can allow for a direct control of a more relevant safety metric in RF pulse design than the ubiquitously used SAR.

While all the considered sequence durations with peak 10-g SAR equal to 10 W/kg could lead to temperature rises higher than 1° C. (see FIG. 5), the results provided in Table 1 show that the pulse design techniques described here can be more powerful and safer by achieving lower NRMSEs with more controlled temperature rises. The same table also shows that SAR constraints can be relaxed to achieve better RF pulse performance, but then with a loss of direct control over the temperature, which increases with sequence duration.

Compared to SAR-constrained techniques, the TVOP approach described here may require more computing efforts because a different set of TVOPs exists for each pulse sequence duration. However, when generic models are used, the TVOPs can be pre-computed only once.

The locations of the TVOPs (see FIG. 3B) also indicate that the maximum temperature rises occur in less sensitive regions (e.g., in the skin) than the brain or other internal structures, where the equilibrium temperature (i.e. the steady state obtained without RF source) is less than 37° C. As such, it is possible that a 1.0-2.0° C. temperature rise constraint can be implemented while remaining conservative with respect to the absolute temperature guidelines.

Because the MLS optimization problem is non-convex, it is uncertain whether a given temperature-constrained or SAR-constrained design corresponds to the global minimum (i.e., the most flip-angle homogenizing solution). The advantages of temperature-regulated RF pulse design numerically demonstrated above appears as a consequence of the multifactorial dependence of temperature.

The model described above for the temperature calculations was Pennes' bio-heat model, but the same method can be applied for any linear model. Taking into account a possible dependence of the thermal parameters on temperature would break the linearity; however, disregarding this dependence puts the thermal calculations on the safe side.

The proposed pulse design method also presents a natural increase in complexity compared to SAR-constrained optimizations because the sliding-integration window used for SAR calculations can no longer be applied, which is especially problematic when different sequences using different RF pulses follow each other. To address this, for temperature-constraint pulse designs, a pause can be interleaved between different pulse sequences to reset the temperature, or the whole imaging exam can be taken into account.

On a more practical note, because SAR hotspots in pTx spatially depend on the designed pulses, and hence the sequences, the resulting temperature rise is at its most additive in the worst-case scenario, and less so in all other cases. As a result, pulses for two sequences can be designed independently, each with a different temperature rise constraint and, thus, a resulting overall temperature rise being upper-bounded by the sum of the two constraints. This design approach offers more latitude in RF pulse design than if SAR constraints were used.

Figure 8:
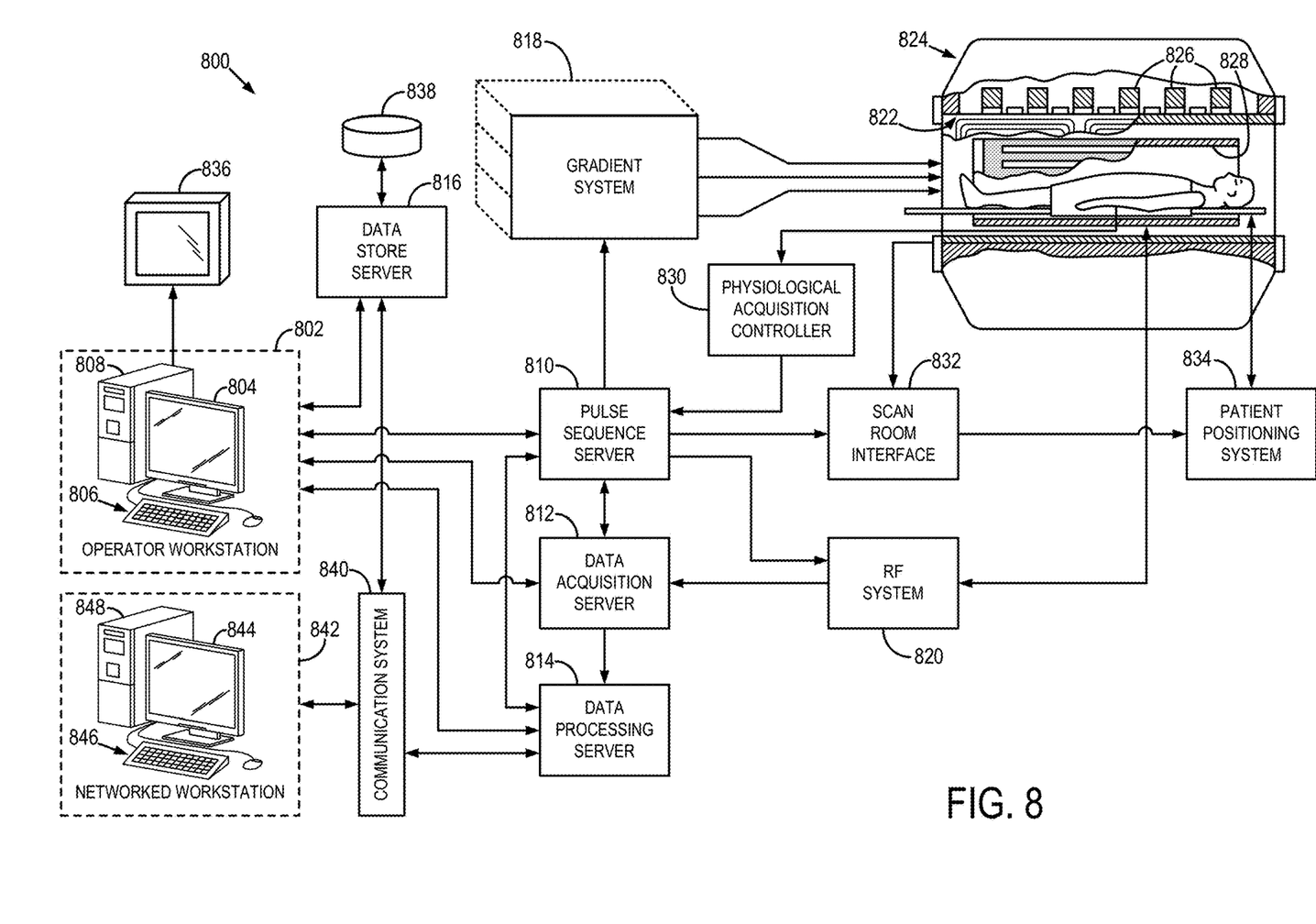
FIG. 8 is a block diagram of an example of a magnetic resonance imaging ("MRI") system.

Referring particularly now to FIG. 8, an example of a magnetic resonance imaging ("MRI") system 800 is illustrated. The MRI system 800 includes an operator workstation 802, which will typically include a display 804; one or more input devices 806, such as a keyboard and mouse; and a processor 808. The processor 808 may include a commercially available programmable machine running a commercially available operating system. The operator workstation 802 provides the operator interface that enables scan prescriptions to be entered into the MRI system 800. In general, the operator workstation 802 may be coupled to four servers: a pulse sequence server 810; a data acquisition server 812; a data processing server 814; and a data store server 816. The operator workstation 802 and each server 810, 812, 814, and 816 are connected to communicate with each other. For example, the servers 810, 812, 814, and 816 may be connected via a communication system 840, which may include any suitable network connection, whether wired, wireless, or a combination of both. As an example, the communication system 840 may include both proprietary or dedicated networks, as well as open networks, such as the internet.

The pulse sequence server 810 functions in response to instructions downloaded from the operator workstation 802 to operate a gradient system 818 and a radiofrequency ("RF") system 820. Gradient waveforms necessary to perform the prescribed scan are produced and applied to the gradient system 818, which excites gradient coils in an assembly 822 to produce the magnetic field gradients $G_x$, $G_y$, and $G_z$ used for position encoding magnetic resonance signals. The gradient coil assembly 822 forms part of a magnet assembly 824 that includes a polarizing magnet 826 and a whole-body RF coil 828.

RF waveforms are applied by the RF system 820 to the RF coil 828, or a separate local coil (not shown in FIG. 8), in order to perform the prescribed magnetic resonance pulse sequence. Responsive magnetic resonance signals detected by the RF coil 828, or a separate local coil (not shown in FIG. 8), are received by the RF system 820, where they are amplified, demodulated, filtered, and digitized under direction of commands produced by the pulse sequence server 810. The RF system 820 includes an RF transmitter for producing a wide variety of RF pulses used in MRI pulse sequences. The RF transmitter is responsive to the scan prescription and direction from the pulse sequence server 810 to produce RF pulses of the desired frequency, phase, and pulse amplitude waveform. The generated RF pulses may be applied to the whole-body RF coil 828 or to one or more local coils or coil arrays (not shown in FIG. 8).

The RF system 820 also includes one or more RF receiver channels. Each RF receiver channel includes an RF preamplifier that amplifies the magnetic resonance signal received by the coil 828 to which it is connected, and a detector that detects and digitizes the I and quadrature components of the received magnetic resonance signal. The magnitude of the received magnetic resonance signal may, therefore, be determined at any sampled point by the square root of the sum of the squares of the I and components:

$$M=\sqrt{I^2+Q^2} \quad (18);$$

and the phase of the received magnetic resonance signal may also be determined according to the following relationship:

$$\varphi = \tan^{-1}\left(\frac{Q}{I}\right). \quad (19)$$

The pulse sequence server 810 also optionally receives patient data from a physiological acquisition controller 830. By way of example, the physiological acquisition controller 830 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 810 to synchronize, or "gate," the performance of the scan with the subject's heart beat or respiration.

The pulse sequence server 810 also connects to a scan room interface circuit 832 that receives signals from various sensors associated with the condition of the patient and the magnet system. It is also through the scan room interface circuit 832 that a patient positioning system 834 receives commands to move the patient to desired positions during the scan.

The digitized magnetic resonance signal samples produced by the RF system 820 are received by the data acquisition server 812. The data acquisition server 812 operates in response to instructions downloaded from the operator workstation 802 to receive the real-time magnetic resonance data and provide buffer storage, such that no data is lost by data overrun. In some scans, the data acquisition server 812 does little more than pass the acquired magnetic resonance data to the data processor server 814. However, in scans that require information derived from acquired magnetic resonance data to control the further performance of the scan, the data acquisition server 812 is programmed to produce such information and convey it to the pulse sequence server 810. For example, during prescans, magnetic resonance data is acquired and used to calibrate the pulse sequence performed by the pulse sequence server 810. As another example, navigator signals may be acquired and used to adjust the operating parameters of the RF system 820 or the gradient system 818, or to control the view order in which k-space is sampled. In still another example, the data acquisition server 812 may also be employed to process magnetic resonance signals used to detect the arrival of a contrast agent in a magnetic resonance angiography ("MRA") scan. By way of example, the data acquisition server 812 acquires magnetic resonance data and processes it in real-time to produce information that is used to control the scan.

The data processing server 814 receives magnetic resonance data from the data acquisition server 812 and processes it in accordance with instructions downloaded from the operator workstation 802. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 814 are conveyed back to the operator workstation 802 where they are stored. Real-time images are stored in a data base memory cache (not shown in FIG. 8), from which they may be output to operator display 802 or a display 836 that is located near the magnet assembly 824 for use by attending physicians. Batch mode images or selected real time images are stored in a host database on disc storage 838. When such images have been reconstructed and transferred to storage, the data processing server 814 notifies the data store server 816 on the operator workstation 802. The operator workstation 802 may be used by an operator to archive the images, produce films, or send the images via a network to other facilities.

The MRI system 800 may also include one or more networked workstations 842. By way of example, a networked workstation 842 may include a display 844; one or more input devices 846, such as a keyboard and mouse; and a processor 848. The networked workstation 842 may be located within the same facility as the operator workstation 802, or in a different facility, such as a different healthcare institution or clinic.

The networked workstation 842, whether within the same facility or in a different facility as the operator workstation 802, may gain remote access to the data processing server 814 or data store server 816 via the communication system 840. Accordingly, multiple networked workstations 842 may have access to the data processing server 814 and the data store server 816. In this manner, magnetic resonance data, reconstructed images, or other data may be exchanged between the data processing server 814 or the data store server 816 and the networked workstations 842, such that the data or images may be remotely processed by a networked workstation 842. This data may be exchanged in any suitable format, such as in accordance with the transmission control protocol ("TCP"), the internet protocol ("IP"), or other known or suitable protocols.

The present invention has been described in terms of one or more preferred embodiments, and it should be appreciated that many equivalents, alternatives, variations, and modifications, aside from those expressly stated, are possible and within the scope of the invention.

We claim:

1. A method for designing parallel transmission radio frequency (RF) pulses for use in magnetic resonance imaging (MRI), the steps of the method comprising:
   (a) providing to a computer system, a set of pre-computed temperature matrices that describe temperature rises in response to RF pulses based on a linear thermal model;
   (b) selecting with the computer system, a set of temperature virtual observation points (TVOPs) based on the pre-computed temperature matrices;
   (c) computing a plurality of RF pulse waveforms for use in MRI by solving, with the computer system, an optimization problem that is constrained by a maximum temperature rise evaluated at the set of TVOPs.

2. The method as recited in claim 1, wherein the pre-computed temperature matrices are computed based in part on a specific absorption rate (SAR) values computed from simulated electric field distributions.

3. The method as recited in claim 2, wherein the simulated electric field distributions are filtered to remove electric field spikes before computing the SAR values.

4. The method as recited in claim 2, wherein the simulated electric field distributions are computed for a particular subject to be imaged.

5. The method as recited in claim 1, wherein the pre-computed temperature matrices are computed for a particular pulse sequence duration.

6. The method as recited in claim 1, wherein step (b) includes selecting as the TVOPs the pre-computed temperature matrices that satisfy, $$\Delta T_k \leq \max(\Delta T(r)) \leq \Delta T_k + \lambda \cdot \Delta T_G$$

wherein $\Delta T_k$ is a temperature rise calculated for a $k^{th}$ TVOP, $\Delta T(r)$ is a temperature rise indicated in a pre-computed temperature matrix, $\Delta T_G$ is an average temperature rise over a volume-of-interest, and $\lambda$ is a tolerance factor that controls a level of compression of the TVOPs.

7. The method as recited in claim 6, wherein $\Delta T_G$ is selected to be an identify matrix.

8. The method as recited in claim 1, wherein selecting the set of TVOPs includes determining eigenvalues for the pre-computed temperature matrices and sorting the pre-computed temperature matrices according the maximum eigenvalues in decreasing order.

9. The method as recited in claim 1, wherein the optimization problem is a magnitude least squares problem.

10. The method as recited in claim 1, wherein solving the optimization problem includes computing the plurality of RF pulse waveforms that minimizes an objective function that is based in part on a selected encoding matrix and a selected flip angle.

11. The method as recited in claim 1, wherein step (c) includes selecting at least one imaging region to which RF pulses should be applied and the objective function includes an encoding matrix and a flip angle for each imaging region.

12. The method as recited in claim 1, wherein the optimization problem is further constrained by at least one of a maximum peak power constraint or an average power constraint.

13. The method as recited in claim 1, further comprising providing the plurality of RF pulse waveforms to an MRI system and controlling the MRI system to generate RF pulses using the plurality of RF pulse waveforms, wherein the RF pulses generate a rise in temperature that is below the maximum temperature rise.

14. The method as recited in claim 1, wherein the TVOPs are selected as a subset of the pre-computed temperature matrices.

15. The method as recited in claim 14, wherein the TVOPs are selected as the subset of the pre-computed temperature matrices that provides a lower-bound and an upper-bound of a maximum temperature rise obtained over the linear thermal model.

* * * * *

UNITED STATES PATENT AND TRADEMARK OFFICE
CERTIFICATE OF CORRECTION

PATENT NO.        : 10,545,210 B2
APPLICATION NO.   : 15/513042
DATED             : January 28, 2020
INVENTOR(S)       : Nicolas Boulant et al.

Page 1 of 1

It is certified that error appears in the above-identified patent and that said Letters Patent is hereby corrected as shown below:

In the Specification

Column 8, Line 42, Eq. (17), delete "$c_i(x) \leq T_x$ for $i = 1,\ldots,N_{TVOPs}$" and insert -- $c_i(x) \leq T_{max}$ for $i = 1,\ldots,N_{TVOPs}$ --.

Signed and Sealed this
Seventeenth Day of March, 2020

Andrei Iancu
*Director of the United States Patent and Trademark Office*